(12) United States Patent
Oketani et al.

(10) Patent No.: US 11,054,695 B2
(45) Date of Patent: Jul. 6, 2021

(54) CHIP-MOUNTED BOARD, DISPLAY DEVICE, AND METHOD FOR PRODUCING CHIP-MOUNTED BOARD

(71) Applicant: SHARP KABUSHIKI KAISHA, Sakai (JP)

(72) Inventors: Taimi Oketani, Sakai (JP); Atsushi Ban, Sakai (JP); Yasuhisa Itoh, Sakai (JP); Takeshi Ishida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/507,627

(22) Filed: Jul. 10, 2019

(65) Prior Publication Data

US 2020/0019016 A1 Jan. 16, 2020

Related U.S. Application Data

(60) Provisional application No. 62/696,511, filed on Jul. 11, 2018.

(51) Int. Cl.
*G02F 1/13357* (2006.01)
*H01L 25/075* (2006.01)
(Continued)

(52) U.S. Cl.
CPC .... *G02F 1/133603* (2013.01); *H01L 25/0753* (2013.01); *H01L 33/0093* (2020.05);
(Continued)

(58) Field of Classification Search
CPC ... G02F 1/133603; G02F 2001/133612; G02F 2001/133614; G02F 1/133611;
(Continued)

(56) References Cited

U.S. PATENT DOCUMENTS 10,032,973 B1 * 7/2018 Bedell ................. H01L 25/0753
2009/0090002 A1 * 4/2009 Motomuro ............. H05K 3/303
29/832

(Continued)

FOREIGN PATENT DOCUMENTS

| JP | 2010-251360 A | 11/2010 |
| JP | 2017-521859 A | 8/2017 |
| WO | 2015/193434 A2 | 12/2015 |

OTHER PUBLICATIONS

F. W. Campbell et al., "Application of fourier analysis to the visibility of gratings", J Physiol, 1968, 197(3):551-566.
(Continued)

*Primary Examiner* — Ahmed N Sefer
(74) *Attorney, Agent, or Firm* — ScienBiziP, P.C.

(57) ABSTRACT

A chip-mounted board including: micro light-emitting chips arranged in a matrix pattern in a light-emitting region; and a conductive line electrically connected to the micro light-emitting chips, the light-emitting region including a first region having a first luminance, a second region having a second luminance lower than the first luminance, and a third region having a third luminance lower than the first luminance and higher than the second luminance, the luminances being values determined with the same magnitude of current supplied to the micro light-emitting chips, the third region being positioned between the first region and the second region and satisfying the following formulas (1) and (2):

$$(1+k)/(1-k) \leq 63.895 \times \tan(0.5°) \times 500/W + 6.0525 \quad (1)$$

$$L2 = k \times L1 \quad (2)$$

wherein L1 represents the first luminance, L2 represents the second luminance, and W represents a width (unit: mm) of the third region.

7 Claims, 8 Drawing Sheets

(51) Int. Cl.
    *H01L 33/62*     (2010.01)
    *H01L 33/00*     (2010.01)
    *H01L 33/50*     (2010.01)
    *G02F 1/1335*     (2006.01)

(52) U.S. Cl.
    CPC ........ *H01L 33/62* (2013.01); *G02F 1/133612* (2021.01); *G02F 1/133614* (2021.01); *H01L 33/505* (2013.01); *H01L 2933/0041* (2013.01); *H01L 2933/0066* (2013.01)

(58) Field of Classification Search
    CPC . H01L 33/0093; H01L 25/0753; H01L 33/62; H01L 2933/0041; H01L 2933/0066; H01L 33/505; H01L 25/167; H01L 33/507; H01L 33/504
    See application file for complete search history.

(56) References Cited

U.S. PATENT DOCUMENTS

| | | |
|---|---|---|
| 2010/0259164 A1 | 10/2010 | Oohata et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0343772 A1 | 11/2016 | Bower et al. |
| 2017/0148650 A1 | 5/2017 | Wu et al. |
| 2018/0158806 A1* | 6/2018 | Lai ...................... H01L 25/0753 |
| 2019/0148598 A1 | 5/2019 | Bower et al. |
| 2019/0157502 A1* | 5/2019 | Moon ................. H01L 33/0093 |

OTHER PUBLICATIONS

Chiharu Suzuki et al., "Acceptable Limit and Evaluation Method of Stripe- or Line-Shaped Image Degradation on Displays", ITE Transactions on Media Technology and Applications, the Institute of Image Information and Television Engineers, 2014, vol. 68, Issue 8, pp. J371-J375. (A concise explanation of the relevance can be found in paragraph [0004] of the specification of the subject application).

* cited by examiner

CHIP-MOUNTED BOARD, DISPLAY DEVICE, AND METHOD FOR PRODUCING CHIP-MOUNTED BOARD

The present application claims priority under 35 U.S.C. § 119 to U.S. Provisional Patent Application No. 62/696,511 filed on Jul. 11, 2018, the contents of which are incorporated herein by reference in their entirety.

BACKGROUND OF THE INVENTION

Field of the Invention

The present invention relates to chip-mounted boards, display devices, and methods for producing a chip-mounted board. More specifically, the present invention relates to a chip-mounted board suitable for use in a display device displaying images using micro light-emitting chips or a display device including micro light-emitting chips as light sources, a display device including the chip-mounted board, and a method for producing a chip-mounted board.

Description of Related Art

Micro-LED displays utilizing a light emitting diode (LED) for each of the red (R), green (G), and blue (B) pixels have been drawing attention. Some related art documents relating to a micro-LED display are JP 2010-251360 A, JP 2017-521859 T, and US 2017/0148650 A1, for example.

Some known academic articles relating to the display performance of a display device are F. W. Campbell and J. G. Robson, "APPLICATION OF FOURIER ANALYSIS TO THE VISIBILITY OF GRATINGS", the Journal of Physiology, U. K., 1968, Vol. 197, pp. 551-566; and Chiharu Suzuki and two others, "Acceptable Limit and Evaluation Method of Stripe- or Line-Shaped Image Degradation on Displays", ITE Transactions on Media Technology and Applications, the Institute of Image Information and Television Engineers, 2014, Volume 68, Issue 8, pp. J371-J375.

BRIEF SUMMARY OF THE INVENTION

In production of a display device by transferring and re-arranging micro light-emitting chips (LEDs) subjected to crystal growth on semiconductor substrates (wafers) onto a single mount board, different emission characteristics (efficiencies, current-voltage characteristics) of the LEDs from different wafers unfortunately cause luminance unevenness of the display device. Especially wafers in different batches (those produced at different times; a batch is a unit of products produced at one time) show significant differences in their characteristics. The luminance unevenness is described in more detail with reference to FIGS. 18A and 18B.

FIGS. 18A and 18B are front views of a conventional chip-mounted board; FIG. 18A shows the structure of a light-emitting region, and FIG. 18B shows a light-on state of the chip-mounted board. In FIG. 18A, "A" indicates each region in which LEDs from Wafer A are rearranged, and "B" indicates each region in which LEDs from Wafer B are rearranged. In the example shown in FIGS. 18A and 18B, Wafer A refers to any wafer in a single batch, and Wafer B refers to any wafer in another single batch different from the batch including Wafer A. When light is turned on in a light-emitting region 11 of a chip-mounted board 10 having the structure shown in FIG. 18A, a display screen 12 has luminance unevenness due to the difference in luminance between the region where the LEDs from Wafer A are rearranged and the region where the LEDs from Wafer B are rearranged as shown in FIG. 18B. This makes perceivable the boundary (joint) of the region where the LEDs from Wafer A are rearranged and the region where the LEDs from Wafer B are rearranged.

Especially in production a display device including a large screen or a high-definition display device, luminance unevenness tends to occur as the light-emitting region is formed by forming micro light-emitting chips on wafers and then transferring and rearranging the micro light-emitting chips on a signal mount board.

As in the above example, use of a plurality of micro light-emitting chips causes luminance unevenness due to different emission characteristics of the micro light-emitting chips. Thus, a method for reducing luminance unevenness is desired.

In response to the above issue, an object of the present invention is to provide a chip-mounted board with reduced luminance unevenness in a light-emitting region in which micro light-emitting chips are arranged, a display device including the chip-mounted board, and a method for producing a chip-mounted board.

(1) An embodiment of the present invention is directed to a chip-mounted board including: micro light-emitting chips arranged in a matrix pattern in a light-emitting region; and a conductive line electrically connected to the micro light-emitting chips, the light-emitting region including a first region having a first luminance, a second region having a second luminance lower than the first luminance, and a third region having a third luminance lower than the first luminance and higher than the second luminance, the luminances being values determined with the same magnitude of current supplied to the micro light-emitting chips, the third region being positioned between the first region and the second region and satisfying the following formulas (1) and (2):

$$(1+k)/(1-k) \leq 63.895 \times \tan(0.5°) \times 500/W + 6.0525 \quad (1)$$

$$L2 = k \times L1 \quad (2)$$

wherein L1 represents the first luminance, L2 represents the second luminance, and W represents a width (unit: mm) of the third region.

(2) In an embodiment of the present invention, the chip-mounted board includes the structure (1) and displays an image by controlling emission of the micro light-emitting chips.

(3) Another embodiment the present invention is also directed to a display device including: the chip-mounted board (1) or (2); and a liquid crystal panel disposed closer to a display surface than the chip-mounted board is, the display device displaying an image by allowing the liquid crystal panel to control an amount of light transmitted through the liquid crystal panel, the light emitted from the micro light-emitting chips.

(4) In an embodiment of the present invention, the display device includes the structure (3) and further includes a fluorescent sheet between the chip-mounted board and the liquid crystal panel, wherein the micro light-emitting chips emit blue light, and the fluorescent sheet converts the blue light into red light or green light.

(5) Yet another embodiment of the present invention is also directed to a method for producing a chip-mounted board including micro light-emitting chips on a target substrate, the method including: a step (1) of forming first micro light-emitting chips on a first semiconductor substrate; a step (2) of forming second micro light-emitting chips on a second semiconductor substrate; and a step (3) of transferring the first micro light-emitting chips on the first semiconductor substrate and the second micro light-emitting chips on the second semiconductor substrate to a target substrate, the step (3) including mounting the first micro light-emitting chips alone in a first region of the target substrate, mounting the second micro light-emitting chips alone in a second region of the target substrate, and mounting a mixture of the first micro light-emitting chips and the second micro light-emitting chips in a third region positioned between the first region and the second region of the target substrate.

(6) In an embodiment of the present invention, the method includes the process (5) and further includes a step (4) of forming an optical functional layer by photolithography on each of the first micro light-emitting chips and the second micro light-emitting chips, wherein the photolithography includes dividing a substrate plane of the target substrate into exposure regions and exposing the exposure regions to light, and no boundary of the exposure regions is positioned in the third region.

The present invention can provide a chip-mounted board with reduced luminance unevenness in a light-emitting region in which micro light-emitting chips are arranged, a display device including the chip-mounted board, and a method for producing a chip-mounted board.

DETAILED DESCRIPTION OF THE INVENTION

The present invention is described in more detail based on embodiments below with reference to the drawings. The embodiments, however, are not intended to limit the scope of the present invention. The configurations of the embodiments may appropriately be combined or modified within the spirit of the present invention.

Embodiment 1

Figure 1A:
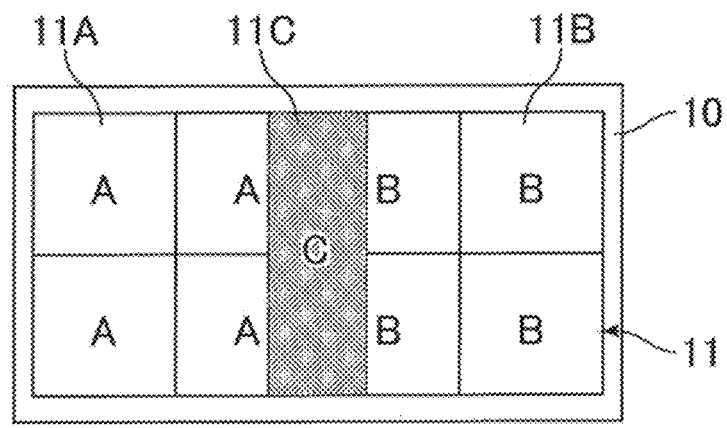
FIG. 1A is a front view of a chip-mounted board of Embodiment 1, showing the structure of a light-emitting region.
Figure 1B:
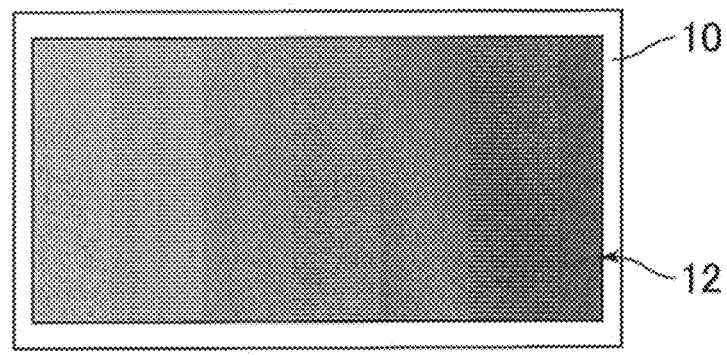
FIG. 1B is a front view of the chip-mounted board of Embodiment 1, showing a light-on state of the light-emitting region.
Figure 2:
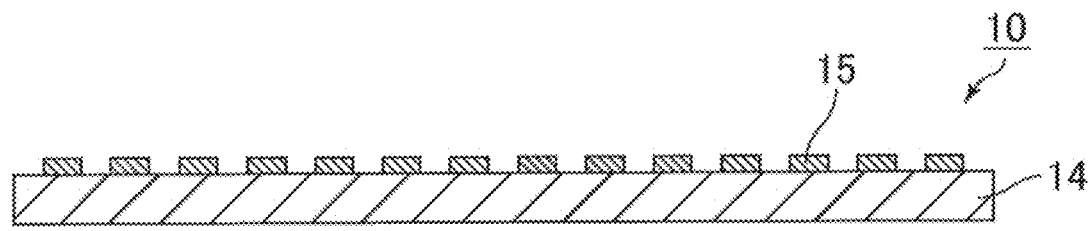
FIG. 2 is a schematic cross-sectional view of the chip-mounted board of Embodiment 1.

A chip-mounted board of Embodiment 1 is used as a display panel in a self-luminous display device. FIG. 1A and FIG. 1B are front views of the chip-mounted board of Embodiment 1. FIG. 1A shows the structure of a light-emitting region. FIG. 1B shows a light-on state of the light-emitting region. FIG. 2 is a schematic cross-sectional view of the chip-mounted board of Embodiment 1. As shown in the figure, a chip-mounted board 10 of the present embodiment includes micro light-emitting chips 15 on a supporting substrate 14, and displays an image by controlling emission of the micro light-emitting chips 15. In FIG. 1A, "A" indicates each region in which the micro light-emitting chips 15 from a semiconductor substrate (hereinafter, also referred to as "Wafer") A are rearranged, "B" indicates each region in which the micro light-emitting chips 15 from Wafer B are rearranged, and "C" indicates a region in which both the micro light-emitting chips 15 from Wafer A and the micro light-emitting chips 15 from Wafer B are rearranged is indicated as "C". Wafer A refers to any wafer in a single batch, and Wafer B refers to any wafer in another single batch different from the batch including Wafer A.

When light is turned on in the entire light-emitting region 11 of the chip-mounted board 10 of Embodiment 1 having the structure shown in FIG. 1A, the luminance of a region (first region) 11A in which the micro light-emitting chips 15 from Wafer A are rearranged is different from the luminance of a region (second region) 11B in which the micro light-emitting chips 15 from Wafer B are rearranged. Yet, the luminance difference (joint) in the display screen 12 is not perceived as shown in FIG. 1B, owing to a region (third region) 11C in which both the micro light-emitting chips 15 from Wafer A and the micro light-emitting chips 15 from Wafer B are rearranged and which is positioned between the first and second regions.

The chip-mounted board 10 of Embodiment 1 alone may constitute a display device, or the chip-mounted board 10 of Embodiment 1 may be combined with another component to constitute a display device.

Each micro light-emitting chip 15 is preferably a light-emitting element that is 100 μm or smaller in at least one of length or width, more preferably in both length and width. The light-emitting element converts electrical energy to light energy and is a semiconductor, preferably an inorganic light-emitting diode.

The micro light-emitting chips 15 are arranged in a matrix pattern in the light-emitting region 11 of the chip-mounted board 10. In the first region 11A and the second region 11B of the light-emitting region 11, the micro light-emitting chips 15 having different current-emission characteristics are arranged. The micro light-emitting chips 15 manufactured using semiconductors, such as inorganic light-emitting diodes, tend to have different current-emission characteristics under different production conditions. Thus, the production efficiency of the chip-mounted board 10 may decrease if as many micro light-emitting chips 15 having the same current-emission characteristics as necessary for arrangement of the micro light-emitting chips 15 in the entire light-emitting region 11 are to be prepared. Meanwhile, arranging the micro light-emitting chips 15 having different current-emission characteristics randomly in the entire light-emitting region 11 leads to inappropriate control of the luminance in the light-emitting region 11, failing to reduce the luminance unevenness. The chip-mounted board 10 of the present embodiment therefore includes a light-emitting region that includes the first region 11A in which first micro light-emitting chips are arranged, the second region 11B in which second micro light-emitting chips having different current-emission characteristics from the first micro light-emitting chips are arranged, and the third region 11C which is positioned between the first region and the second region and in which the first micro light-emitting chips and the second micro light-emitting chips mixed at a specific ratio are arranged. As a result, the light-emitting region 11 includes the first region 11A having a first luminance L1, the second region having a second luminance L2 lower than the first luminance L1, and the third region 11C having a third luminance L3 lower than the first luminance L1 and higher than the second luminance L2, the luminances determined with the same magnitude of current supplied to the micro light-emitting chips 15.

In order to achieve a sufficient effect of reducing the luminance unevenness in the boundary of the first region 11A and the second region 11B, the width W of the third region 11C in the present embodiment satisfies the following formula (1) in consideration of the luminance ratio k, which is the ratio between the first luminance L1 of the first region 11A and the second luminance L2 of the second region 11B. This can prevent the display unevenness in the display screen 12 as shown in FIG. 1B. The luminance ratio k is defined by the following formula (2), and preferably satisfies the relationship k>0.8 in order to maintain the degree of uniformity in luminance in the entire light-emitting region 11.

$$(1+k)/(1-k) \leq 63.895 \times \tan(0.5°) \times 500/W + 6.0525 \quad (1)$$

$$L2 = k \times L1 \quad (2)$$

The following describes the reason why the effect of reducing the luminance unevenness is achieved in the light-emitting region 11 when the formula (1) is satisfied, with reference to FIGS. 3 to 6.

Figure 3:
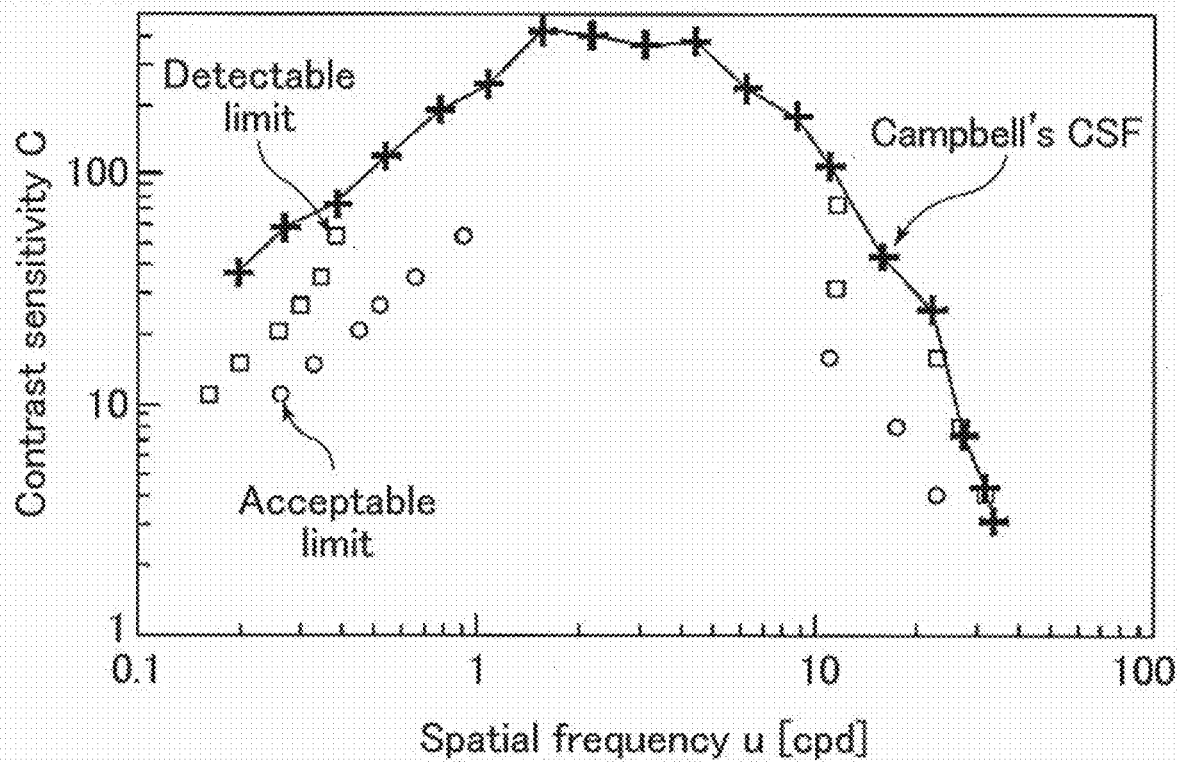
FIG. 3 is a graph showing the acceptable limits and the detectable limits of an image whose luminance changes periodically, which is cited from FIG. 7 in "Acceptable Limit and Evaluation Method of Stripe- or Line-Shaped Image Degradation on Displays".
Figure 7:
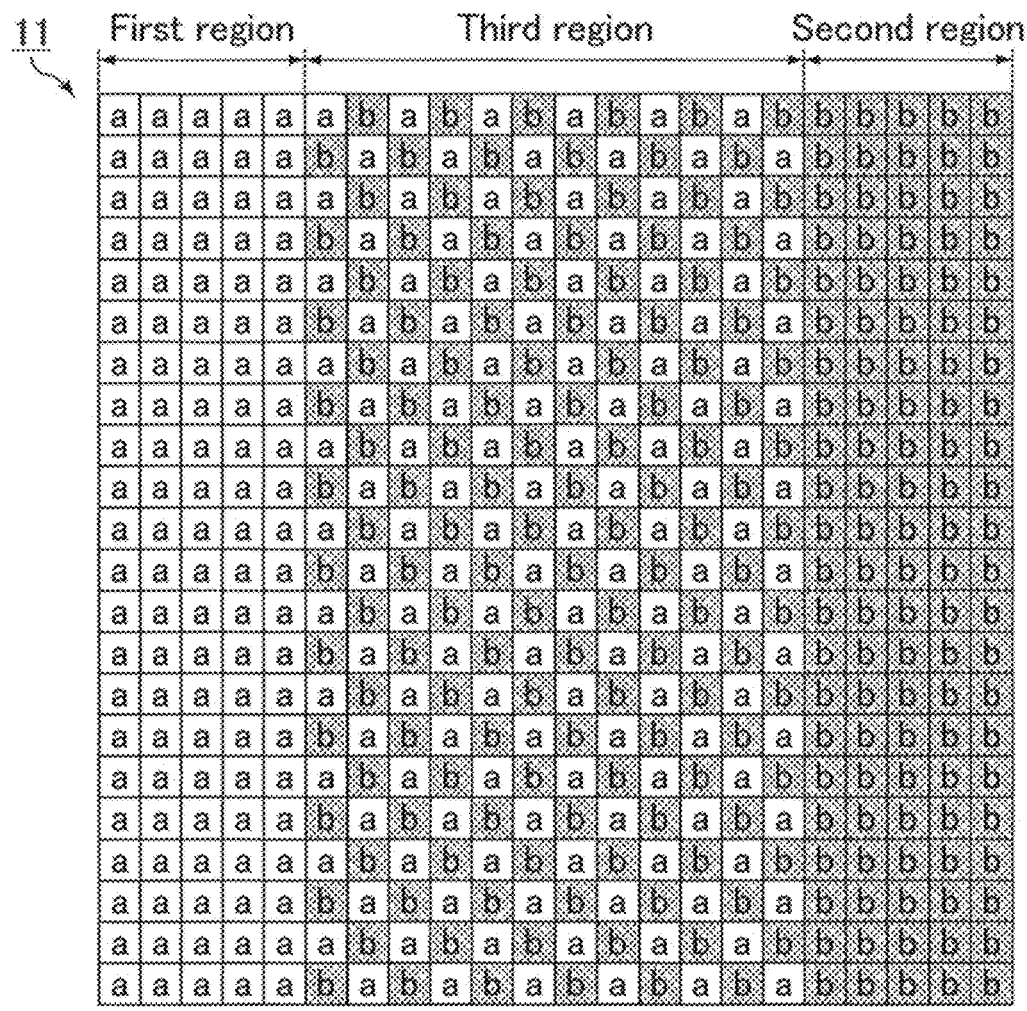
FIG. 7 is a front view of a light-emitting region with a preferred exemplary arrangement pattern of LEDs from Wafer A and LEDs from Wafer B.

FIG. 3 is a graph showing the acceptable limits and the detectable limits of an image whose luminance changes periodically, which is cited from FIG. 7 in "Acceptable Limit and Evaluation Method of Stripe- or Line-Shaped Image Degradation on Displays". The "spatial frequency u" in FIG. 3 means the number of dark/light cycles in one degree (unit degree) of visual angle (cycle per degree: cpd). The "contrast sensitivity C" in FIG. 3 is defined by the following formula (3), wherein Lmax represents the maximum luminance change and Lmin represents the minimum luminance change.

$$C = (L\max + L\min)/(L\max - L\min) \quad (3)$$

The luminance change at the joint of the first region 11A and the second region 11B in the present embodiment in terms of the contrast sensitivity C in FIG. 3 satisfies the following formula (4).

$$C = (L1 + L2)/(L1 - L2) \quad (4)$$

As shown in the formula (4), a larger difference between the first luminance L1 of the first region 11A and the second luminance L2 of the second region 11B leads to a lower contrast sensitivity C. A contrast sensitivity C lower than the detectable limit can be considered to allow an observer to detect the luminance difference, and a contrast sensitivity C lower than the acceptable limit can be considered to allow the observer to perceive the luminance difference as a defect decreasing the image quality. This means that the contrast sensitivity C needs at least to be equal to or higher than the acceptable limit in order to reduce the luminance unevenness. The graph of FIG. 3 shows that when the spatial frequency u is 1 cpd or lower, the contrast sensitivity C at which the detectable limit or the acceptable limit is determined increases as the spatial frequency u increases.

Substituting the formula (2) into the formula (4) enables conversion of the formula (4) to the following formula (5) showing the relationship between the contrast sensitivity C and the luminance ratio k. The left side of the formula (1) corresponds to the right side of the formula (5).

$$C = (1+k)/(1-k) \quad (5)$$

Figure 4:
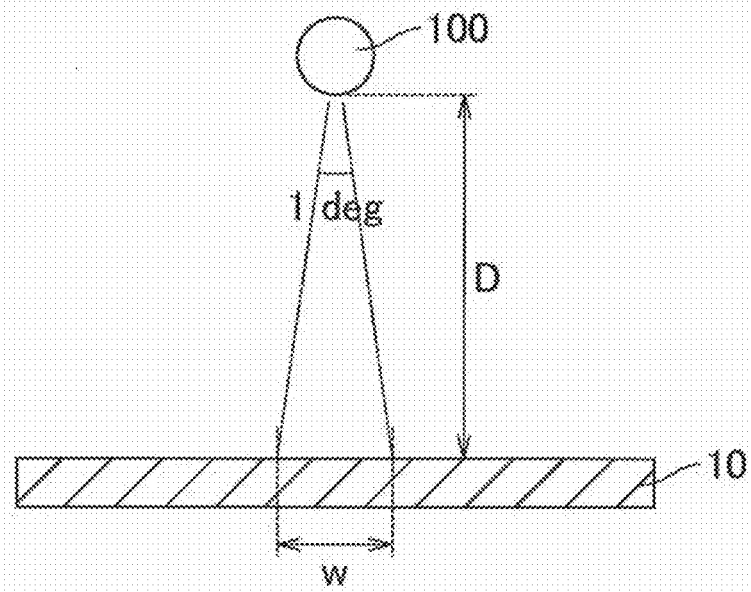
FIG. 4 is a view illustrating how to determine luminance unevenness in a light-emitting region of a chip-mounted board.

FIG. 4 is a view illustrating how to determine luminance unevenness in a light-emitting region of a chip-mounted board. As shown in FIG. 4, the distance D from an observer 100 to the light-emitting surface of the chip-mounted board 10 is set to 500 mm, in consideration of the use conditions of the chip-mounted board 10 in a display device. Here, a unit degree of visual angle (1°) of the field of vision of the observer 100 projected onto the light-emitting surface of the chip-mounted board 10 corresponds to a length (hereinafter, also referred to as "unit angle width w") of 8.727 mm on the light-emitting surface of the chip-mounted board 10. The spatial frequency u, which is the number of dark/light cycles in a unit degree of visual angle, corresponds to the number of dark/light cycles possibly included in the unit angle width w. Thus, the length of one dark/light cycle corresponding to the spatial frequency u can be represented by w/u.

Figure 5:
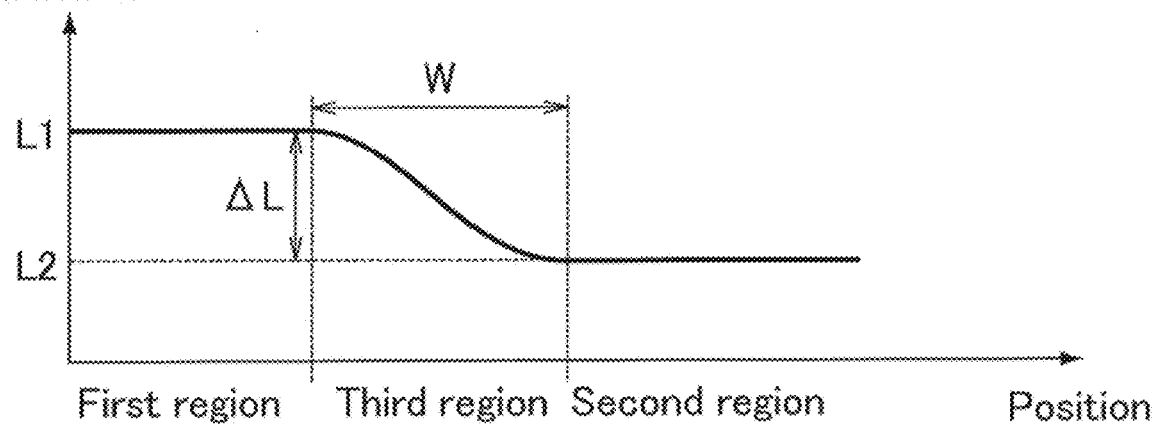
FIG. 5 is a graph schematically showing luminance changes in a light-emitting region of a chip-mounted board.

FIG. 5 is a graph schematically showing luminance changes in a light-emitting region of a chip-mounted board. As shown in FIG. 5, when the luminance change in the width direction of the light-emitting surface is approximated to ½ of the period of a sine wave, the length W of the region (width of the third region 11C) with the luminance change (ΔL=L1−L2) in the light-emitting region 11 corresponds to half the length of the period P of the sine wave. Converting the period P of the sine wave into the spatial frequency u gives the following formula (6).

$$W=P/2=w/u/2 \quad (6)$$

FIG. 4 shows that the unit angle width w is represented by the following formula (7).

$$w=2\times\tan(0.5°)\times D \quad (7)$$

Substituting the formula (7) and D=500 (mm) into the formula (6) gives the following formula (8).

$$u=\tan(0.5°)\times 500/W \quad (8)$$

The contrast sensitivity C can be calculated from the formula (5) using the luminance ratio k. The spatial frequency u can be calculated from the formula (8) using the width W of the third region 11C. Thus, the width W of the third region 11C may be adjusted based on the luminance ratio k in such a way the corresponding contrast sensitivity C exceeds the acceptable limits with reference to FIG. 3.

Figure 6:
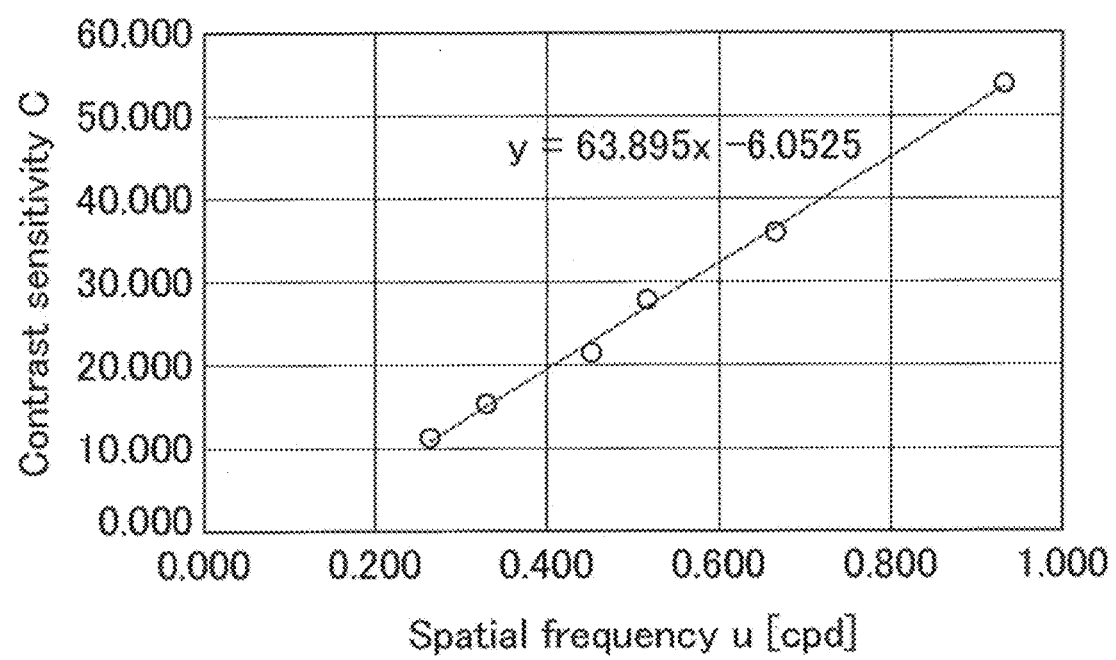
FIG. 6 is a graph showing a straight line obtained by converting the logarithmic axis of the graph in FIG. 3 to a linear axis and determining a linear regression line using the acceptable limits.

FIG. 6 is a graph showing a straight line obtained by converting the logarithmic axis of the graph in FIG. 3 to a linear axis and determining a linear regression line using the acceptable limits. The obtained straight line is represented by the following formula (9).

$$C\min=63.895\times u+6.0525 \quad (9)$$

Cmin in the formula (9) corresponds to the acceptable limit, and thus the following formula (10) needs to be satisfied in terms of luminance unevenness reduction.

$$C\leq 63.895\times u+6.0525 \quad (10)$$

Substituting the formulas (5) and (8) into the formula (10) gives the formula (1). Consequently, satisfying the formula (1) enables achievement of the effect of reducing the luminance unevenness in the light-emitting region 11.

In the present embodiment, the luminance unevenness at the joint (boundary) of the first region 11A and the second region 11B can be reduced by appropriately controlling the mixing ratio of the first micro light-emitting chips and the second micro light-emitting chips to be arranged in the third region 11C. The mixing ratio of the first micro light-emitting chips and the second micro light-emitting chips to be arranged in the third region 11C is preferably determined such that the proportion of the first micro light-emitting chips is high on the first region 11A side in the third region 11C, the proportions of the first micro light-emitting chips and the second micro light-emitting chips are approximately the same at the center of the third region 11C, and the proportion of the second micro light-emitting chips is high on the second region 11B side in the third region 11C.

Figure 8:
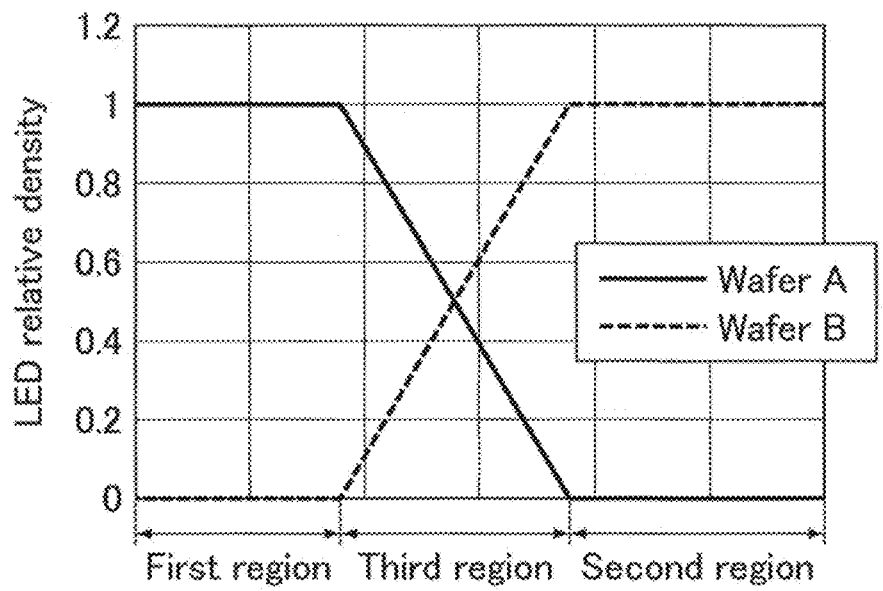
FIG. 8 is a graph showing another preferred exemplary arrangement pattern of LEDs from Wafer A and LEDs from Wafer B.

The combination of the first micro light-emitting chips and the second micro light-emitting chips can be, for example, a combination of LEDs from Wafer A and LEDs from Wafer B. FIG. 7 is a front view of a light-emitting region with a preferred exemplary arrangement pattern of LEDs from Wafer A and LEDs from Wafer B. FIG. 8 is a graph showing another preferred exemplary arrangement pattern of LEDs from Wafer A and LEDs from Wafer B. In FIG. 7, each LED from Wafer A is indicated as "a" and each LED from Wafer B is indicated as "b".

The supporting substrate 14 may be a glass substrate or a resin substrate. The resin substrate may have any thickness, and may be a flexible resin film. On the supporting substrate 14 are formed conductive lines electrically connected to the micro light-emitting chips 15. Electrical signals to be supplied to the micro light-emitting chips 15 through the corresponding conductive lines control the emission timing and luminance of each micro light-emitting chip 15.

The chip-mounted board 10 may be driven in any mode such as a passive matrix mode or an active matrix mode.

Figure 9:
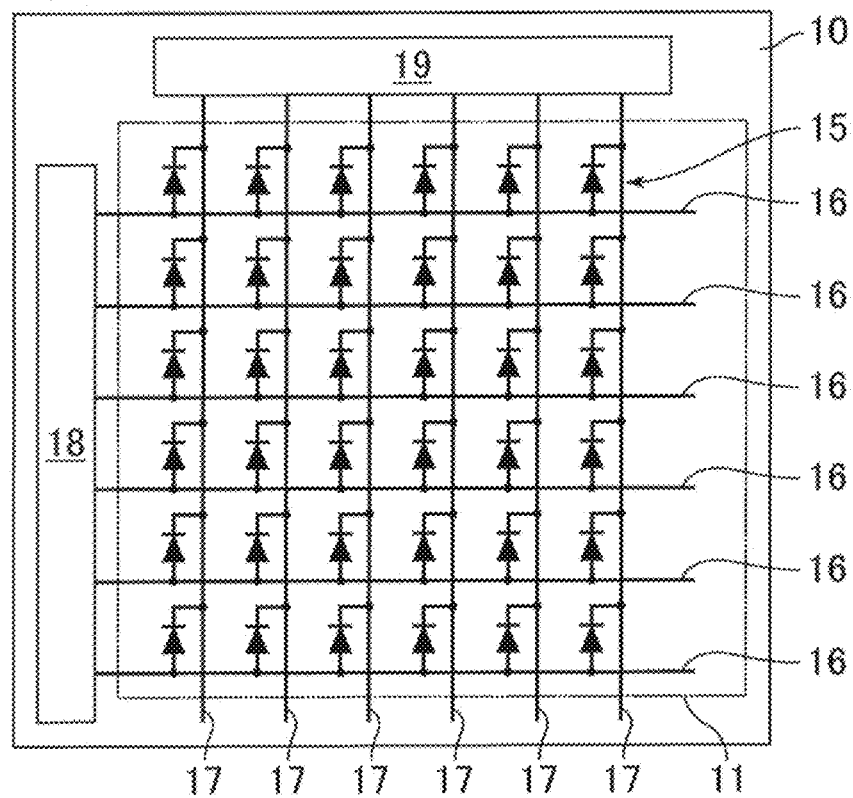
FIG. 9 is a front view of a chip-mounted board, showing a circuit structure for a passive matrix mode.

FIG. 9 is a front view of a chip-mounted board, showing a circuit structure for a passive matrix mode. The chip-mounted board 10 shown in FIG. 9 includes the light-emitting region (display region) 11 and a peripheral region thereof. In the light-emitting region 11 are formed scanning lines 16 and signal lines 17 in vertical and horizontal directions. One micro light-emitting chip (LED) 15 is arranged at the intersection of one scanning line 16 and one signal line 17. One micro light-emitting chip 15 constitutes one pixel. The light-emitting region 11 corresponds to a pixel array part where pixels are arranged. In the peripheral region are arranged a row drive circuit 18 that drives the scanning lines 16 and a column drive circuit 19 that supplies video signals corresponding to the luminance information to the signal lines 17.

Figure 10:
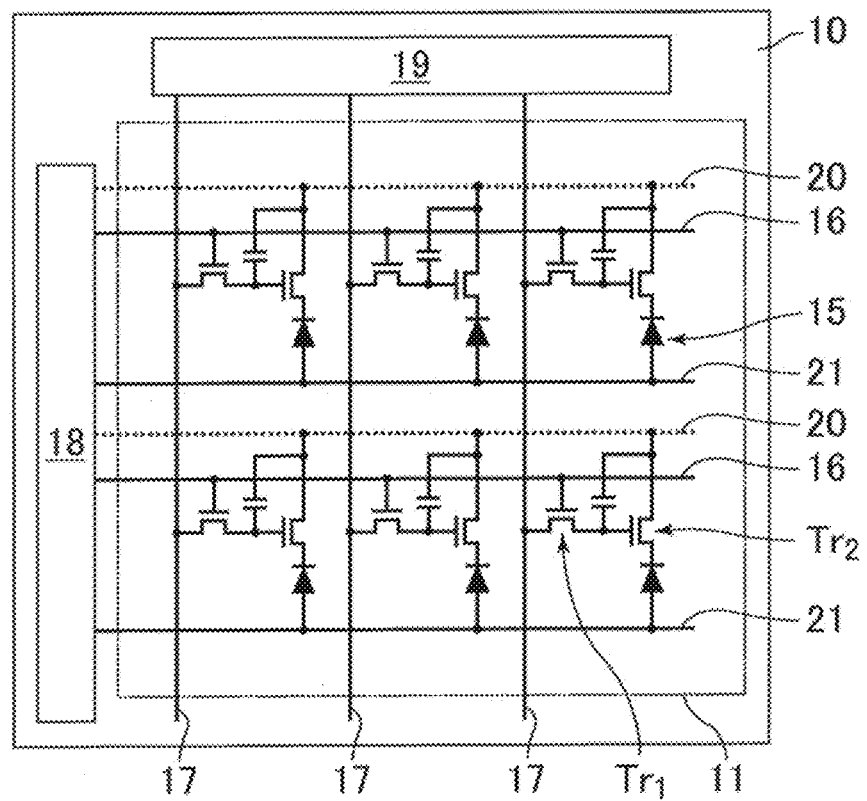
FIG. 10 is a front view of a chip-mounted board, showing a circuit structure for an active matrix mode.

FIG. 10 is a front view of a chip-mounted board, showing a circuit structure for an active matrix mode. The chip-mounted board 10 shown in FIG. 10 includes the light-emitting region (display region) 11 and a peripheral region thereof. In the light-emitting region 11 are formed the scanning lines 16 and the signal lines 17 in vertical and horizontal directions. One pixel circuit including one micro light-emitting chip (LED) 15 is arranged at the intersection of one scanning line 16 and one signal line 17. One pixel circuit constitutes one pixel. The light-emitting region 11 corresponds to the pixel array part where pixels are arranged. In the peripheral region are arranged the row drive circuit 18 that drives the scanning lines 16 and the column drive circuit 19 that supplies video signals corresponding to the luminance information to the signal lines 17.

Each pixel circuit includes, for example, a switching thin-film transistor Tr1, a driving thin-film transistor Tr2, a storage capacitor, and the micro light-emitting chip (LED) 15. The switching thin-film transistor Tr1 is connected to the corresponding scanning line 16 and the corresponding signal line 17. To the thin-film transistor Tr1 are connected the driving thin-film transistor Tr2 and the storage capacitor. The driving thin-film transistor Tr2 and the storage capacitor are connected to a common power supply line 20. The LED is connected to the driving thin-film transistor Tr2 and a power supply line 21.

In the active matrix mode, the row drive circuit 18 drives each scanning line to store into the storage capacitor a video signal written from the corresponding signal line 17 through the switching thin-film transistor Tr1. A current corresponding to the intensity of the stored signal is supplied to the LED 15 through the driving thin-film transistor Tr2. The LED 15 emits light with the luminance corresponding to the magnitude of current.

A method for producing the chip-mounted board 10 of Embodiment 1 is described. A preferred method for producing the chip-mounted board 10 of Embodiment 1 is a method including forming the micro light-emitting chips 15 on a semiconductor substrate and transferring the obtained micro light-emitting chips 15 to the supporting substrate (target substrate) 14. It is difficult in production to set the number of the micro light-emitting chips 15 obtainable from one semiconductor substrate to equal to or an integral multiple of the number of the micro light-emitting chips 15 to be arranged in the light-emitting region of the chip-mounted board 10. Thus, the micro light-emitting chips 15 obtained from two or more semiconductor substrates are transferred to one target substrate 14.

When the relationship X<Y holds wherein X represents the number of chips from a single semiconductor substrate and Y represents the number of pixels in the display device, chips from some semiconductor substrates need to be rearranged. This case corresponds to, for example, the cases of producing a display device including a large screen or a high-definition display device. Also when the relationship X>Y or X≠nY (n is a positive integer) holds, chips from some semiconductor substrates are suitably rearranged such that the micro light-emitting chips 15 are used without any waste.

The micro light-emitting chips 15 formed on different semiconductor substrates can have different current-emission characteristics. Still, the light-emitting region 11 includes the first region 11A in which the first micro light-emitting chips from the first semiconductor substrate are arranged, the second region 11B in which the second micro light-emitting chips from the second semiconductor substrate are arranged, and the third region 11C which is positioned between the first region 11A and the second region 11B and in which a mixture of the first micro light-emitting chips and the second micro light-emitting chips is arranged. This structure can reduce the luminance unevenness in the light-emitting region 11 while preventing the transfer of the micro light-emitting chips 15 from becoming complicated. The luminance unevenness in the light-emitting region 11 can be more effectively reduced by rearranging the micro light-emitting chips 15 on the target substrate 14 such that the formula (1) is satisfied.

Specific preferred examples of the method for producing the chip-mounted board 10 include a method including a step (1) of forming the first micro light-emitting chips on the first semiconductor substrate; a step (2) of forming the second micro light-emitting chips on the second semiconductor substrate; and a step (3) of transferring the first micro light-emitting chips on the first semiconductor substrate and the second micro light-emitting chips on the second semiconductor substrate to the target substrate 14, the step (3) including mounting the first micro light-emitting chips alone in the first region 11A of the target substrate 14, mounting the second micro light-emitting chips alone in the second region 11B of the target substrate 14, and mounting a mixture of the first micro light-emitting chips and the second micro light-emitting chips in the third region 11C positioned between the first region 11A and the second region 11B of the target substrate 14.

The method for forming the micro light-emitting chips 15 in the steps (1) and (2) may be any method, and may be a known method for forming LEDs. Specific examples of the method for forming the micro light-emitting chips 15 include a method including forming through crystal growth a stack of layers (i.e., an LED light-emitting layer) including an N layer, a light-emitting layer, a P layer, and a buffer layer, for example, on a semiconductor substrate (wafer), which is a semiconductor such as silicon, sapphire, or gallium arsenide; and forming parts such as electrodes, conductive lines, and a protective film and separating LED elements.

The transfer of the micro light-emitting chips 15 in the step (3) may be performed by any method. For example, a known LED transfer method may be used, such as a pick-and-place technique including picking up the micro light-emitting chips 15 on a wafer and mounting them onto the target substrate 14, or a monolithic integration technique including directly mounting the micro light-emitting chips 15 on a wafer onto the target substrate 14. Specifically, the method disclosed in US 2017/0148650 A1 or the method disclosed in JP 2010-251360 A may be used. The pick-and-place technique picks up the micro light-emitting chips 15 on a wafer one by one using electrostatic chucks, vacuum chucks, or magnetic heads, for example. For rearrangement of the micro light-emitting chips 15 on the target substrate 14 at the desired pitch, the micro light-emitting chips 15 may be picked up while some of the micro light-emitting chips 15 on the wafer are removed. The micro light-emitting chips 15 picked up from the wafer may be directly transferred to the target substrate 14 or may be temporarily placed on a transfer substrate and then transferred to the target substrate 14.

Embodiment 2

Figure 11:
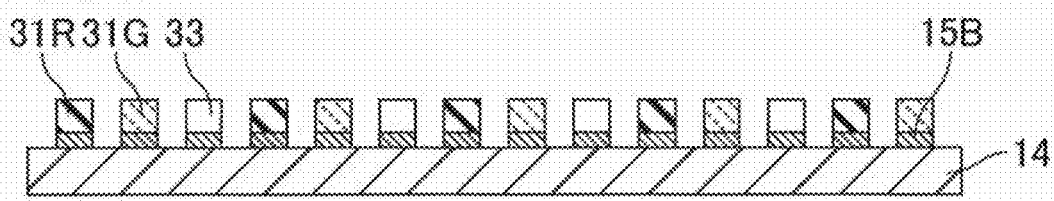
FIG. 11 is a schematic cross-sectional view of a chip-mounted board of Embodiment 2.

FIG. 11 is a schematic cross-sectional view of a chip-mounted board of Embodiment 2. As shown in the figure, a chip-mounted board of the present embodiment employs light-emitting diodes (blue LEDs) 15B, which emit blue light, as the micro light-emitting chips for RGB full-color display. In each red pixel are arranged a blue LED 15B and a phosphor (red phosphor) 31R, which emits red fluorescent light, on the blue LED 15B. In each green pixel are arranged a blue LED 15B and a phosphor (green phosphor) 31G, which emits green fluorescent light, on the blue LED 15B. The phosphor may be of any type, and may be, for example, a quantum dot phosphor. No phosphor is arranged in a blue pixel, and therefore a scattering layer 33 may be arranged on the blue LED 15B. The scattering layer 33 enables surface emission of blue pixels and control of angle characteristics.

Figure 12:
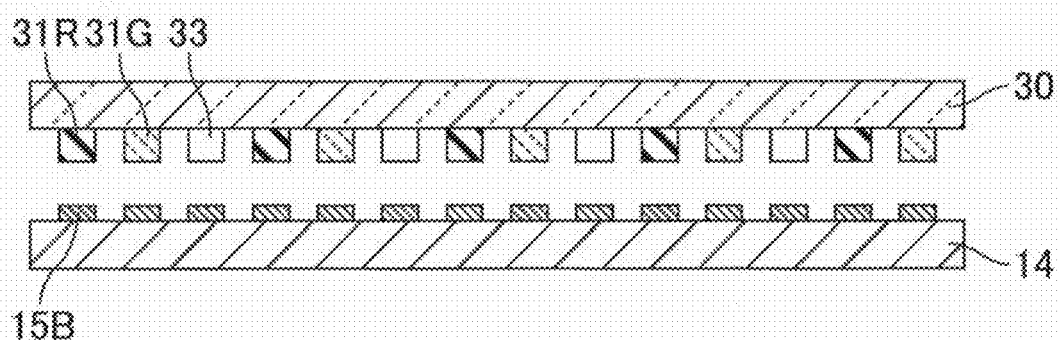
FIG. 12 is a schematic cross-sectional view of a chip-mounted board of a modified example of Embodiment 2.

FIG. 12 is a schematic cross-sectional view of a chip-mounted board of a modified example of Embodiment 2. The red phosphors 31R, the green phosphors 31G, and the scattering layers 33 may each be directly formed on the corresponding blue LED 15B as shown in FIG. 11, or may each be formed on the counter substrate 30, which is then bonded to the chip-mounted board (LED substrate) 10 with a constant space in between as shown in FIG. 12. This enables reduction of degradation of the layers under heat.

Figure 13A:
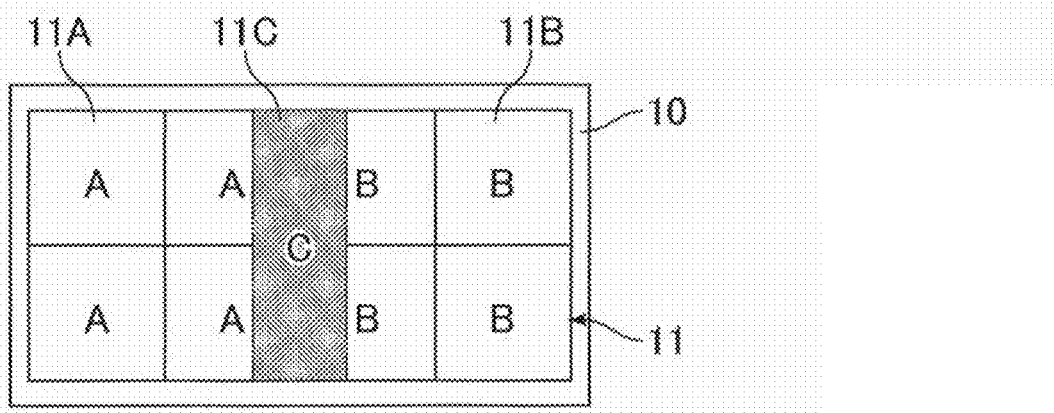
FIG. 13A is a front view of the chip-mounted board of Embodiment 2, showing the structure of a light-emitting region.

FIG. 13A is a front view of the chip-mounted board of Embodiment 2, showing the structure of a light-emitting region. As shown in the figure, the blue LEDs 15B in Embodiment 2 are arranged such that the region (third region) 11C in which both the blue LEDs 15B from Wafer A and the blue LEDs 15B from Wafer B are rearranged is positioned between the first region 11A and the second region 11B, as in the micro light-emitting chips of Embodiment 1. The red phosphors 31R, the green phosphors 31G, and the scattering layers 33 are formed at the respective specific positions by ink-jetting or patterning using photolithography. In the case of forming the optical functional layers such as the red phosphors 31R, the green phosphors 31G, and the scattering layers 33 by patterning using photolithography, the substrate plane of the target substrate 14 may be divided into exposure regions, and step exposure may be performed for each exposure region.

Figure 13B:
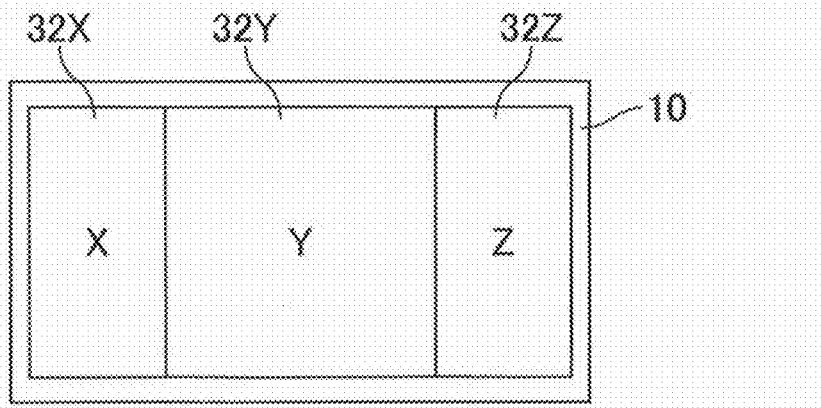
FIG. 13B is a front view of a chip-mounted board, showing a distribution pattern of exposure regions.

FIG. 13B is a front view of a chip-mounted board, showing a distribution pattern of exposure regions. FIG. 13B shows exposure regions 32X, 32Y, and 32Z as "X", "Y", and "Z", respectively. Dividing the light-emitting region 11 into the exposure regions 32X, 32Y, and 32Z produces the boundaries (joints in light exposure) of the exposure regions 32X, 32Y, and 32Z in the light-emitting region 11. These boundaries of the exposure regions 32X, 32Y, and 32Z preferably do not overlap the third region 11C, which is the rearrangement boundary of the blue LEDs 15B, as shown in FIG. 13B. This can reduce the luminance unevenness. The boundaries of the exposure regions 32X, 32Y, and 32Z may not be linear. For example, a region with a predetermined width in which both the exposure region 32X and the exposure region 32Y are present may be formed, so that the luminance unevenness can be further reduced.

Embodiment 2 enables effective reduction of the luminance unevenness in the light-emitting region 11 in RGB full-color display. Since the luminance unevenness is likely to be more perceivable in intermediate color display than in monochromatic color display, reducing the luminance unevenness in RGB full-color display is significantly effective in increasing the display quality of the display device.

Embodiment 3

Figure 14:
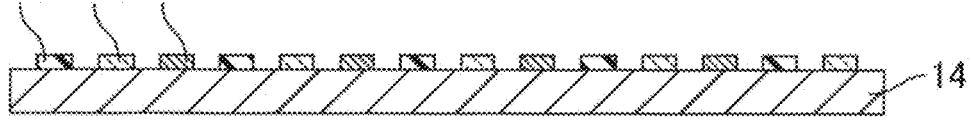
FIG. 14 is a schematic cross-sectional view of a chip-mounted board of Embodiment 3.

FIG. 14 is a schematic cross-sectional view of a chip-mounted board of Embodiment 3. As shown in the figure, a chip-mounted board of the present embodiment employs chips (red LEDs) 15R, which emit red light, chips (green LEDs) 15G, which emit green light, and chips (blue LEDs) 15B, which emit blue light, as micro light-emitting chips for RGB full-color display.

Figure 15A:
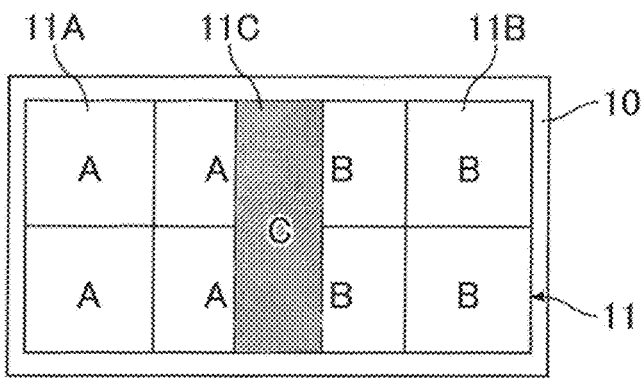
FIG. 15A is a front view of the chip-mounted board of Embodiment 3, showing an arrangement pattern of red LEDs.
Figure 15B:
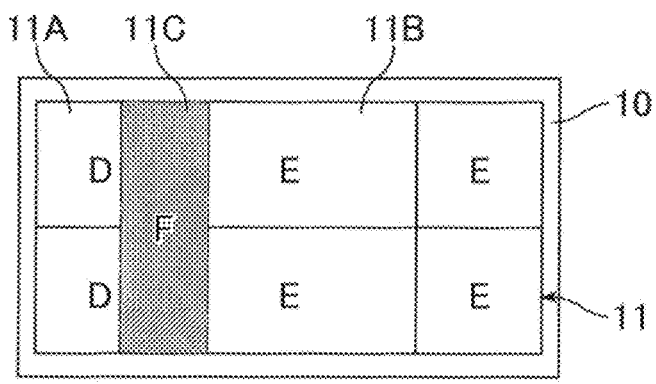
FIG. 15B is a front view of the chip-mounted board of Embodiment 3, showing an arrangement pattern of green LEDs.
Figure 15C:
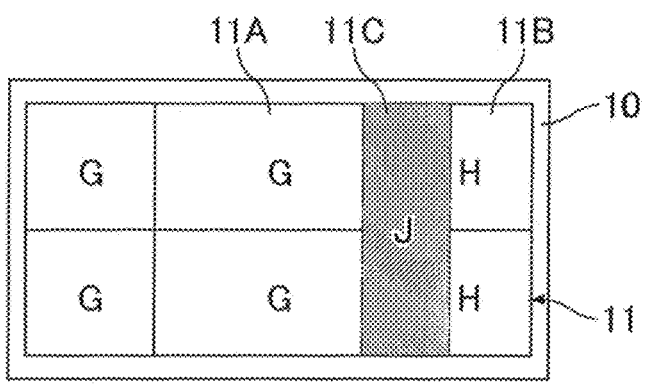
FIG. 15C is a front view of the chip-mounted board of Embodiment 3, showing an arrangement pattern of blue LEDs.

FIGS. 15A, 15B, and 15C are front views of the chip-mounted board of Embodiment 3. FIG. 15A shows an arrangement pattern of the red LEDs 15R. FIG. 15B shows an arrangement pattern of the green LEDs 15G. FIG. 15C shows an arrangement pattern of the blue LEDs 15B. In FIG. 15A, "A" indicates each region in which the red LEDs 15R from Wafer A are rearranged, "B" indicates each region in which the red LEDs 15R from Wafer B are rearranged, and "C" indicates the region in which both the red LEDs 15R from Wafer A and the red LEDs 15R from Wafer B are rearranged. In FIG. 15B, "D" indicates each region in which the green LEDs 15G from Wafer D are rearranged, "E" indicates each region in which the green LEDs 15G from Wafer E are rearranged, and "F" indicates the region in which both the green LEDs 15G from Wafer D and the green LEDs 15G from Wafer E are rearranged. In FIG. 15C, "G" indicates each region in which the blue LEDs 15B from Wafer G are rearranged, "H" indicates each region in which the blue LEDs 15B from Wafer H are rearranged, and "J" indicates the region in which both the blue LEDs 15B from Wafer G and the blue LEDs 15B from Wafer H are rearranged. Luminance unevenness is more inconspicuous in monochromatic display of red, green, or blue than in multi-color display (white display or gray display). Yet, the luminance unevenness in monochromatic display can be reduced by rearranging the LEDs such that a region in which the LEDs from different wafers are rearranged is included in at least one of the arrangement patterns for the red LEDs 15R, the green LEDs 15G, and the blue LEDs 15B, as shown in FIGS. 15A, 15B, and 15C. Also, the luminance unevenness in monochromatic display can be more effectively reduced by rearranging the LEDs such that a combination of the first region 11A, the second region 11B, and the third region 11C which satisfies the formulas (1) and (2) is formed with regard to at least one of the red LEDs 15R, the green LEDs 15G, or the blue LEDs 15B.

In the chip-mounted board of Embodiment 3, a combination of the first region 11A, the second region 11B, and the third region 11C is preferably formed in which the green LEDs 15G emitting green light, which is most perceivable among the red, green, and blue lights, satisfy the formulas (1) and (2) are rearranged. This enables formation of a combination of the first region 11A, the second region 11B, and the third region 11C satisfying the formulas (1) and (2) also in full-color display.

As shown in FIGS. 15A, 15B, and 15C, the rearrangement joints of the red LEDs 15R, the green LEDs 15G, and the blue LEDs 15B from different wafers are preferably at different positions in the light-emitting region 11. This enables more effective reduction of the luminance unevenness in the light-emitting region 11 also in RGB full-color display in Embodiment 3.

Embodiment 4

Figure 16:
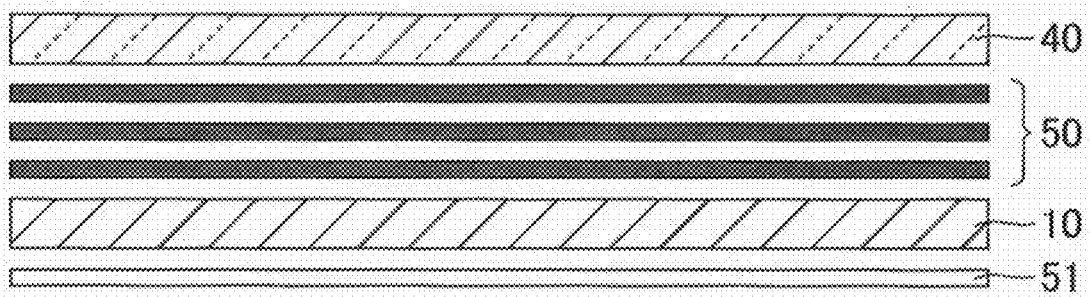
FIG. 16 is a schematic cross-sectional view of a liquid crystal display device of Embodiment 4.

Although Embodiments 1 to 3 employ a chip-mounted board as the display panel in a self-luminous display device, a chip-mounted board can be used also as a lighting device. Embodiment 4 corresponds to the case where a chip-mounted board is used as the backlight of a liquid crystal display device. FIG. 16 is a schematic cross-sectional, view of a liquid crystal display device of Embodiment 4. As shown in the figure, the liquid crystal display device of the present embodiment includes the chip-mounted board 10 of any one of Embodiments 1 to 3 on the back surface of the liquid crystal panel 40. The liquid crystal panel 40 can be a known liquid crystal panel used in a liquid crystal display device. The liquid crystal panel 40 displays an image by controlling the amount of light transmitted through each pixel, the light emitted from the micro light-emitting chips. Various optical sheets 50 may be arranged between the chip-mounted board 10 and the liquid crystal panel 40. The optical sheets 50 may be, for example, sheets including a prism sheet and a diffusion sheet.

For an increase in light use efficiency, a reflective sheet 51 may be disposed on the back surface of the chip-mounted board 10. The reflective sheet 51 may be provided with holes in which micro light-emitting chips are to be placed and may be disposed on the upper surface of the chip-mounted board 10. In place of the reflective sheet 51, a layer of a metal having a high reflectance, such as Ag or Al, may be formed on the front or back surface of the chip-mounted board 10.

Figure 17:
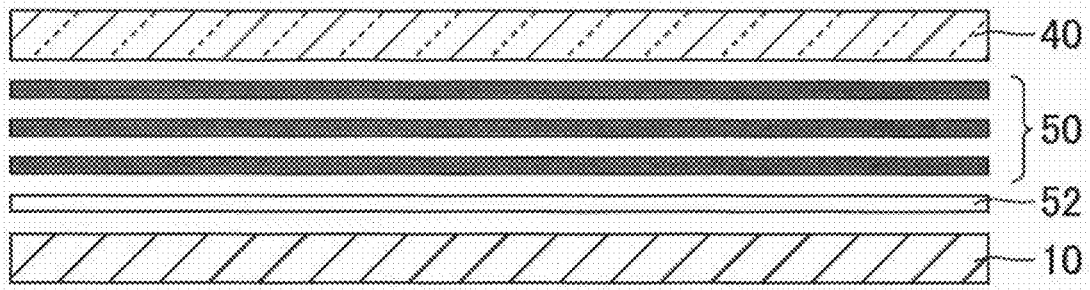
FIG. 17 is a schematic cross-sectional view of a liquid crystal display device of a modified example of Embodiment 4.
Figure 18A:
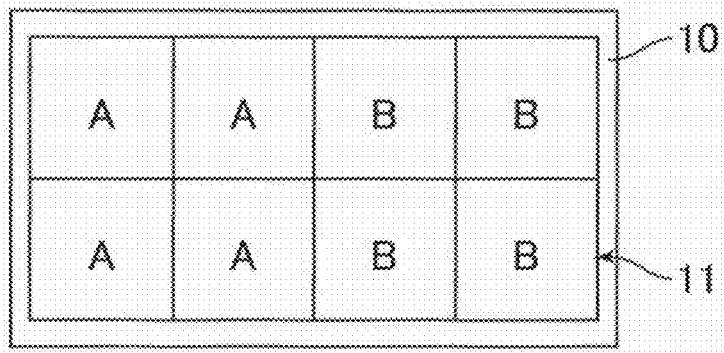
FIG. 18A is a front view of a conventional chip-mounted board, showing the structure of a light-emitting region.
Figure 18B:
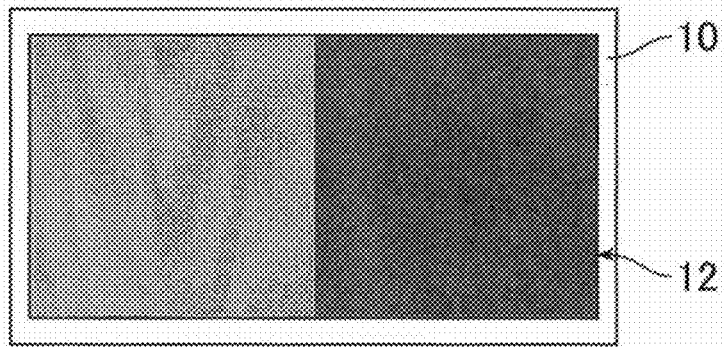
FIG. 18B is a front view of a conventional chip-mounted board, showing a light-on state of the chip-mounted board.

FIG. 17 is a schematic cross-sectional view of a liquid crystal display device of a modified example of Embodiment 4. For RGB full-color display, as shown in FIG. 17, a fluorescent sheet 52 that converts part of blue light into light including red and green rays may be disposed between the chip-mounted board 10 and the liquid crystal panel 40. This embodiment requires the blue LEDs alone as the micro light-emitting chips on the chip-mounted board 10, and utilizes the fluorescent sheet 52 to achieve RGB full-color display.

The fluorescent sheet 52 is, for example, a sheet in which a green phosphor and a red phosphor are dispersed in a resin or glass. The green phosphor can be a fluorescent material that absorbs blue light and emits green light. The red phosphor can be a fluorescent material that absorbs one or both of blue light and green light and emits red light. The fluorescent material may be of any type, and may be, for example, a quantum dot phosphor.

Embodiment 4 can provide a thin direct-lit backlight with reduced luminance unevenness. Since the backlight has a function (local dimming control function) to control the brightness in each pixel or area, a liquid crystal display device having a high contrast ratio can be achieved.

What is claimed is:
1. A chip-mounted board comprising:
   micro light-emitting chips arranged in a matrix pattern in a light-emitting region; and
   a conductive line electrically connected to the micro light-emitting chips, the light-emitting region including a first region having a first luminance, a second region having a second luminance lower than the first luminance, and a third region having a third luminance lower than the first luminance and higher than the second luminance, the first, second and third luminances being values determined with a same magnitude of current supplied to the micro light-emitting chips, the third region being positioned between the first region and the second region and satisfying the following formulas (1) and (2):

$$(1+k)/(1-k) \leq 63.895 \times \tan(0.5°) \times 500/W + 6.0525 \quad (1)$$

$$L2 = k \times L1 \quad (2)$$

wherein L1 represents the first luminance, L2 represents the second luminance, k represents a constant of proportionality, and W represents a width (unit: mm) of the third region.

2. The chip-mounted board according to claim 1, wherein the chip-mounted board displays an image by controlling emission of the micro light-emitting chips.

3. A display device comprising:
the chip-mounted board according to claim 1; and
a liquid crystal panel disposed closer to a display surface than the chip-mounted board is,
the display device displaying an image by allowing the liquid crystal panel to control an amount of light transmitted through the liquid crystal panel, the light emitted from the micro light-emitting chips.

4. The display device according to claim 3, further comprising a fluorescent sheet between the chip-mounted board and the liquid crystal panel,
wherein the micro light-emitting chips emit blue light, and
the fluorescent sheet converts the blue light into red light or green light.

5. A method for producing a chip-mounted board according to claim 1, the method comprising:
a step (1) of forming first micro light-emitting chips on a first semiconductor substrate;
a step (2) of forming second micro light-emitting chips on a second semiconductor substrate; and
a step (3) of transferring the first micro light-emitting chips on the first semiconductor substrate and the second micro light-emitting chips on the second semiconductor substrate to a target substrate,
the step (3) including mounting the first micro light-emitting chips alone in a first region of the target substrate, mounting the second micro light-emitting chips alone in a second region of the target substrate, and mounting a mixture of the first micro light-emitting chips and the second micro light-emitting chips in a third region positioned between the first region and the second region of the target substrate.

6. The method for producing a chip-mounted board according to claim 5, further comprising a step (4) of forming an optical functional layer by photolithography on each of the first micro light-emitting chips and the second micro light-emitting chips,
wherein the photolithography includes dividing a substrate plane of the target substrate into exposure regions and exposing the exposure regions to light, and
no boundary of the exposure regions is positioned in the third region.

7. The chip-mounted board according to claim 1,
wherein the micro light-emitting chips include chips emitting green light, and
the chips emitting green light are arranged to satisfy the formulas (1) and (2) in the third region.

* * * * *